(12) United States Patent
Ichikawa et al.

(10) Patent No.: US 11,585,873 B2
(45) Date of Patent: Feb. 21, 2023

(54) MAGNETORESISTIVE EFFECT ELEMENT CONTAINING TWO NON-MAGNETIC LAYERS WITH DIFFERENT CRYSTAL STRUCTURES

(71) Applicants: TDK CORPORATION, Tokyo (JP); NATIONAL INSTITUTE FOR MATERIALS SCIENCE, Tsubaka (JP)

(72) Inventors: Shinto Ichikawa, Tokyo (JP); Katsuyuki Nakada, Tokyo (JP); Hiroaki Sukegawa, Tsukuba (JP); Seiji Mitani, Tsukuba (JP); Tadakatsu Ohkubo, Tsukuba (JP); Kazuhiro Hono, Tsukuba (JP)

(73) Assignees: TDK CORPORATION, Tokyo (JP); NATIONAL INSTITUTE FOR MATERIALS SCIENCE, Tsukuba (JP)

( * ) Notice: Subject to any disclaimer, the term of this patent is extended or adjusted under 35 U.S.C. 154(b) by 0 days.

(21) Appl. No.: 17/370,613

(22) Filed: Jul. 8, 2021

(65) Prior Publication Data

US 2023/0009284 A1    Jan. 12, 2023

(51) Int. Cl.
*G01R 33/09* (2006.01)
*G11B 5/39* (2006.01)
(Continued)

(52) U.S. Cl.
CPC ......... *G01R 33/093* (2013.01); *G01R 33/098* (2013.01); *G11B 5/39* (2013.01);
(Continued)

(58) Field of Classification Search
None
See application file for complete search history.

(56) References Cited

U.S. PATENT DOCUMENTS

| 11,056,639 B2 * | 7/2021 | Nakada | H01L 43/08 |
| 2009/0243007 A1 * | 10/2009 | Buttet | H01F 41/307 |
| | | | 257/E29.323 |

(Continued)

FOREIGN PATENT DOCUMENTS

| JP | 5586028 B2 | 9/2014 |
| JP | 5988019 B2 | 9/2016 |
| WO | 2018/230466 A1 | 12/2018 |

OTHER PUBLICATIONS

Sukegawa et al., "Tunnel magnetoresistance with improved bias voltage dependence in lattice-matched Fe/spinel MgAl2O4/Fe(001) junctions," Applied Physics Letters, 2010, vol. 96, pp. 212505-1-212505-3.

(Continued)

*Primary Examiner* — Jefferson A Evans
(74) *Attorney, Agent, or Firm* — Oliff PLC

(57) ABSTRACT

A magnetoresistive effect element includes: a first ferromagnetic layer; a second ferromagnetic layer; and a non-magnetic layer provided between the first ferromagnetic layer and the second ferromagnetic layer, wherein the non-magnetic layer includes a first layer and a second layer, and wherein a lattice constant α of the first layer and a lattice constant β of the second layer satisfy a relationship of $\beta - 0.04 \times \alpha \leq 2 \times \alpha \leq \beta + 0.04 \times \alpha$.

12 Claims, 7 Drawing Sheets

(51) Int. Cl.
  H01L 43/10   (2006.01)
  G11C 11/16   (2006.01)
  H01L 43/02   (2006.01)
  H01L 43/08   (2006.01)

(52) U.S. Cl.
  CPC .......... G11B 5/3909 (2013.01); G11C 11/161 (2013.01); H01L 43/02 (2013.01); H01L 43/08 (2013.01); H01L 43/10 (2013.01)

(56) References Cited

U.S. PATENT DOCUMENTS

| | | | |
|---|---|---|---|
| 2012/0091548 A1 | 4/2012 | Sukegawa et al. | |
| 2013/0221461 A1* | 8/2013 | Sukegawa | H01L 43/10 257/E29.323 |
| 2016/0180869 A1* | 6/2016 | Zhang | G11B 5/3909 428/811.1 |
| 2016/0380184 A1* | 12/2016 | Kato | H01L 43/02 257/421 |
| 2017/0221508 A1* | 8/2017 | Kryder | G11B 5/1278 |
| 2018/0069173 A1* | 3/2018 | Sonobe | H01L 27/222 |
| 2018/0090670 A1* | 3/2018 | Sasaki | G11C 11/161 |
| 2018/0090671 A1* | 3/2018 | Kato | H01L 43/10 |
| 2018/0090673 A1* | 3/2018 | Sasaki | H01L 43/10 |
| 2018/0090677 A1* | 3/2018 | Sasaki | H01L 43/08 |
| 2018/0108834 A1* | 4/2018 | Sasaki | H01L 27/105 |
| 2019/0043548 A1* | 2/2019 | Park | H01L 43/10 |
| 2020/0044144 A1 | 2/2020 | Sukegawa et al. | |
| 2020/0212295 A1* | 7/2020 | Suzuki | H01L 43/10 |
| 2020/0274057 A1* | 8/2020 | Pushp | H01L 43/10 |
| 2020/0303630 A1* | 9/2020 | Ichikawa | H01L 43/14 |
| 2021/0028354 A1* | 1/2021 | Sasaki | G11C 11/161 |
| 2021/0123991 A1* | 4/2021 | Sukegawa | G01R 33/098 |
| 2021/0134380 A1* | 5/2021 | Noh | H01L 43/10 |
| 2021/0343321 A1* | 11/2021 | Wang | G11C 11/161 |
| 2021/0359200 A1* | 11/2021 | Lee | G11C 11/1655 |
| 2022/0165939 A1* | 5/2022 | Jeong | H01F 10/1936 |

OTHER PUBLICATIONS

Miura et al., "First-principles study of tunneling magnetoresistance in Fe/MgAl2O4/Fe(001) magnetic tunnel junctions," Physical Review B, 2012, vol. 86, pp. 024426-1-024426-6.

Scheike et al., "Lattice-matched magnetic tunnel unctions usuign a Heusler alloy Co2FeAl and a cation-disorder spinel Mg—Al—O barrier," Applied Physics Letters, 2014, vol. 105, pp. 242407-1-242407-5.

* cited by examiner

MAGNETORESISTIVE EFFECT ELEMENT CONTAINING TWO NON-MAGNETIC LAYERS WITH DIFFERENT CRYSTAL STRUCTURES

BACKGROUND OF THE INVENTION

Field of the Invention

The present invention relates to a magnetoresistive effect element.

Description of Related Art

Giant magnetoresistive (GMR) elements composed of a multilayer film of a ferromagnetic layer and a non-magnetic layer and tunnel magnetoresistive (TMR) elements using an insulating layer (tunnel barrier layer, barrier layer) as a non-magnetic layer are known. Generally, the TMR elements have a higher element resistance than the GMR elements, but have a larger magnetoresistive (MR) ratio. The TMR elements are gaining attention as elements for magnetic sensors, radio frequency components, magnetic heads, and non-volatile random access memories (MRAMs).

The TMR elements can be classified into two types according to the difference in the mechanism of electron tunnel conduction. One is a TMR element that uses only the exudation effect (tunnel effect) of the wave functions between ferromagnetic layers.

The other is a TMR element which is dominated by coherent tunneling in which the symmetry of the wave function is maintained (Only electrons having symmetry of a specific wave function tunnel). The TMR element in which the coherent tunneling is dominant has a large MR ratio as compared with the TMR element using only the tunnel effect.

MgO is an example of the tunnel barrier layer in which a coherent tunneling phenomenon occurs. Further, as an alternative material to MgO, for example, a ternary oxide (Mg—Al—O) composed of Mg, Al, and O is also being studied. Compared to MgO, Mg—Al—O has improved lattice matching with ferromagnetic materials, and even when a high voltage is applied, the MR ratio is less likely to decrease than that of the conventional MgO.

For example, Japanese Patent No. 5586028 describes an example in which $MgAl_2O_4$ having a spinel-type crystal structure is used for the tunnel barrier layer.

Further, Japanese Patent No. 5988019 describes a ternary oxide (Mg—Al—O) having a cubic crystal (cation disordered spinel structure) having a lattice constant of half that of a spinel structure. Since the cation disordered spinel structure is a metastable structure, a tunnel barrier layer can be formed without being limited to the stoichiometric composition of the spinel-type structure. In the cation disordered spinel structure, the lattice constant can be continuously changed by adjusting the Mg—Al composition ratio. Further, Japanese Patent No. 5988019 describes a magnetoresistive effect element in which a tunnel barrier layer having a cation disordered spinel structure and BCC-type Co—Fe-based ferromagnetic layers are combined. When the tunnel barrier layer of the cation disordered spinel structure is combined with the BCC-type Co—Fe-based ferromagnetic layers, the band folding effect is suppressed, and the magnetoresistive effect element stably exhibits a large MR ratio.

SUMMARY OF THE INVENTION

The present invention has been made in view of the above-described circumstances and an object is to provide a magnetoresistive effect element having a large MR ratio. The present invention provides the following means in order to solve the above-described problems.

(1) A magnetoresistive effect element according to a first aspect includes: a first ferromagnetic layer; a second ferromagnetic layer; and a non-magnetic layer provided between the first ferromagnetic layer and the second ferromagnetic layer, wherein the non-magnetic layer includes a first layer and a second layer, and wherein a lattice constant $\alpha$ of the first layer and a lattice constant $\beta$ of the second layer satisfy a relationship of $\beta - 0.04 \times \alpha \leq 2 \times \alpha \leq \beta + 0.04 \times \alpha$.

(2) The magnetoresistive effect element according to a second aspect includes: a first ferromagnetic layer; a second ferromagnetic layer; and a non-magnetic layer provided between the first ferromagnetic layer and the second ferromagnetic layer, wherein the non-magnetic layer includes a first layer and a second layer, wherein a crystal structure of the first layer is a NaCl structure or a cation disordered spinel structure, and wherein a crystal structure of the second layer is an ordered spinel structure.

(3) In the magnetoresistive effect element according to the above-described aspect, the first layer and the second layer may be oxides containing at least one of elements A and B, the element A may be Mg or Zn, the element B may be one or more selected from the group consisting of Al, Ga, Ti, and In, the first layer may have a higher proportion of the element A than the second layer, and the second layer may have a higher proportion of the element B than the first layer.

(4) In the magnetoresistive effect element according to the above-described aspect, the first layer may be an oxide of an alloy of the elements A and B represented by $A_xB_{1-x}$, the second layer may be an oxide of an alloy of the elements A and B represented by $A_yB_{1-y}$, x may satisfy $0 \leq x \leq 1.0$, and y may satisfy $0 \leq y \leq 0.5$.

(5) In the magnetoresistive effect element according to the above-described aspect, the first layer may be an oxide of an alloy represented by $Mg_xAl_{1-x}$, the second layer may be an oxide of an alloy represented by $Mg_yAl_{1-y}$, x may satisfy $0.5 \leq x \leq 1.0$, and y may satisfy $0 \leq y \leq 0.5$.

(6) The magnetoresistive effect element according to the above-described aspect may further include: a substrate on which the first ferromagnetic layer, the non-magnetic layer, and the second ferromagnetic layer are stacked and the first layer may be closer to the substrate than the second layer.

(7) In the magnetoresistive effect element according to the above-described aspect, the first layer may have a lower oxygen concentration than the second layer.

(8) In the magnetoresistive effect element according to the above-described aspect, the first layer and the second layer may be mainly (001) oriented in a stacking direction.

DETAILED DESCRIPTION OF THE INVENTION

Figure 1:
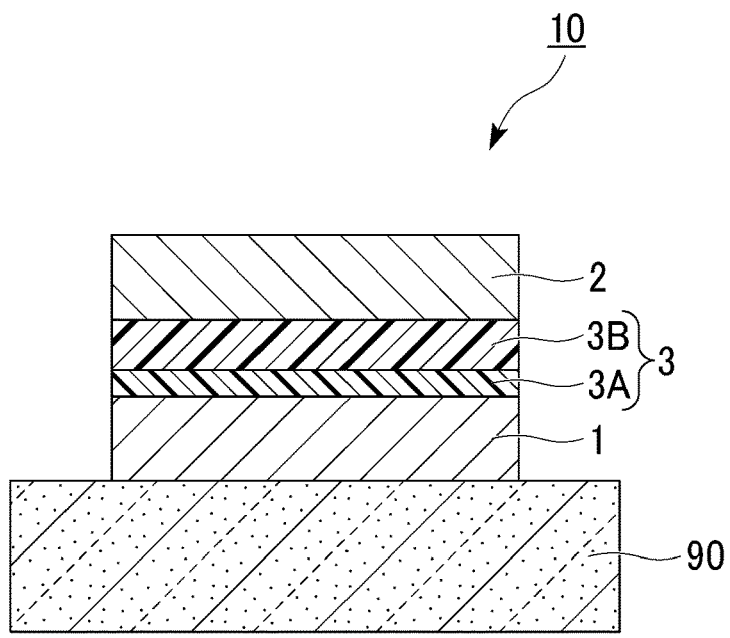
FIG. 1 is a cross-sectional view of a magnetoresistive effect element according to a first embodiment.

Hereinafter, this embodiment will be described in detail by appropriately referring to the drawings. In the drawings used in the following description, in order to make the features of this embodiment easy to understand, the featured parts may be enlarged for convenience, and the dimensional ratios of each component may differ from the actual ones. The materials, dimensions, and the like provided in the following description are merely exemplary examples, and the present invention is not limited thereto. Then, the present invention can be appropriately modified without changing the spirit thereof.

First Embodiment

FIG. 1 is a cross-sectional view of a magnetoresistive effect element according to a first embodiment. First, directions will be defined. A direction in which each layer is stacked may be referred to as a stacking direction. Further, a direction that intersects the stacking direction and spreads each layer may be referred to as an in-plane direction.

A magnetoresistive effect element 10 shown in FIG. 1 is located on a substrate 90. Another layer may be provided between the magnetoresistive effect element 10 and a substrate 90. The substrate 90 is, for example, a semiconductor substrate, sapphire, a single crystal substrate, or the like.

The magnetoresistive effect element 10 shown in FIG. 1 includes a first ferromagnetic layer 1, a second ferromagnetic layer 2, and a non-magnetic layer 3. The non-magnetic layer 3 is located between the first ferromagnetic layer 1 and the second ferromagnetic layer 2.

The magnetoresistive effect element 10 outputs a change in the relative angle between the magnetization of the first ferromagnetic layer 1 and the magnetization of the second ferromagnetic layer 2 as a resistance value change. The magnetization of the second ferromagnetic layer 2 is easier to move than, for example, the magnetization of the first ferromagnetic layer 1. When a predetermined external force is applied, the magnetization direction of the first ferromagnetic layer 1 does not change (fixed), and the magnetization direction of the second ferromagnetic layer 2 changes. As the magnetization direction of the second ferromagnetic layer 2 changes with respect to the magnetization direction of the first ferromagnetic layer 1, the resistance value of the magnetoresistive effect element 10 changes. In this case, the first ferromagnetic layer 1 may be referred to as a magnetization fixed layer, and the second ferromagnetic layer 2 may be referred to as a magnetization free layer. The first ferromagnetic layer 1 is preferably located on the side of the substrate 90, which is the underlayer of the second ferromagnetic layer 2, in order to increase the stability of magnetization.

Hereinafter, the first ferromagnetic layer 1 is described as a magnetization fixed layer and the second ferromagnetic layer 2 is described as a magnetization free layer, but this relationship may be reversed. Further, since the magnetoresistive effect element 10 outputs a change in the relative angle between the magnetization of the first ferromagnetic layer 1 and the magnetization of the second ferromagnetic layer 2 as a resistance value change, both the magnetization of the first ferromagnetic layer 1 and the magnetization of the second ferromagnetic layer 2 may move (that is, both the first ferromagnetic layer 1 and the second ferromagnetic layer 2 may be the magnetization free layers).

The difference in the ease of movement between the magnetization of the first ferromagnetic layer 1 and the magnetization of the second ferromagnetic layer 2 when a predetermined external force is applied is caused by the difference in coercive force between the first ferromagnetic layer 1 and the second ferromagnetic layer 2. For example, if the thickness of the second ferromagnetic layer 2 is thinner than the thickness of the first ferromagnetic layer 1 when the first ferromagnetic layer 1 and the second ferromagnetic layer 2 are made of the same material, the coercive force of the second ferromagnetic layer 2 becomes smaller than the coercive force of the first ferromagnetic layer 1.

Further, for example, a ferromagnetic layer may be provided on the surface opposite to the non-magnetic layer 3 of the first ferromagnetic layer 1 through a spacer layer. The first ferromagnetic layer 1, the spacer layer, and the ferromagnetic layer have a synthetic antiferromagnetic structure (SAF structure). The synthetic antiferromagnetic structure consists of two magnetic layers sandwiching the spacer layer. By magnetically coupling the first ferromagnetic layer 1 and the ferromagnetic layer, the coercive force of the first ferromagnetic layer 1 becomes larger than the case without the ferromagnetic layer. The ferromagnetic layer is, for example, IrMn, PtMn, or the like. The spacer layer contains, for example, at least one selected from a group consisting of Ru, Ir, and Rh.

The first ferromagnetic layer 1 and the second ferromagnetic layer 2 contain ferromagnetic materials. The ferromagnetic material constituting the first ferromagnetic layer 1 and the second ferromagnetic layer 2 is, for example, a metal selected from a group consisting of Cr, Mn, Co, Fe, and Ni, an alloy containing one or more of these metals, or an alloy containing these metals and at least one or more elements of B, C, and N. The first ferromagnetic layer 1 and the second ferromagnetic layer 2 contain, for example, an Fe element. The first ferromagnetic layer 1 and the second ferromagnetic layer 2 containing the Fe element have a high spin polarization, and the MR ratio of the magnetoresistive effect element 10 is large. The first ferromagnetic layer 1 and the second ferromagnetic layer 2 are, for example, Fe, Co—Fe, Co—Fe—B, Ni—Fe.

The first ferromagnetic layer 1 and the second ferromagnetic layer 2 may be Heusler alloys. Some of the Heusler alloys exhibiting ferromagnetism have a half-metallic band structure and has a high spin polarization. The Heusler alloys are intermetallic compounds having a chemical composition of XYZ or $X_2YZ$, X is a transition metal element or noble metal element of Group Co, Fe, Ni, Cu on the periodic table, Y is a transition metal of Group Mn, V, Cr, Ti, or an elemental species of X, and Z is a typical element of Groups III to V. The Heusler alloys are, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, or the like.

The thickness of the first ferromagnetic layer 1 and the second ferromagnetic layer 2 is, for example, 3 nm or less. If the thickness of the first ferromagnetic layer 1 and the second ferromagnetic layer 2 is thin, interfacial magnetic anisotropy appears at the interface between the first ferromagnetic layer 1 or the second ferromagnetic layer 2 and the non-magnetic layer 3, and the magnetization directions of the first ferromagnetic layer 1 and the second ferromagnetic layer 2 tend to be oriented perpendicular to the stacked surface.

The non-magnetic layer 3 is located between the first ferromagnetic layer 1 and the second ferromagnetic layer 2. The non-magnetic layer 3 is called a tunnel barrier layer. The non-magnetic layer 3 includes a plurality of layers. The boundaries between the plurality of layers do not have to be clearly discernible. If different compositions and crystal structures can be confirmed when the non-magnetic layer 3 is analyzed at different positions in the stacking direction, it can be determined that the non-magnetic layer 3 includes a plurality of layers.

The non-magnetic layer 3 contains a non-magnetic oxide. The non-magnetic layer 3 is made of, for example, a non-magnetic oxide. The non-magnetic oxide is, for example, an oxide containing at least one of element A and element B. The element A is, for example, Mg or Zn. The element B is, for example, one or more selected from the group consisting of Al, Ga, Ti, and In.

The non-magnetic layer 3 includes, for example, a first layer 3A and a second layer 3B. The first layer 3A is located closer to, for example, the substrate 90 than the second layer 3B.

The first layer 3A and the second layer 3B contain the above-described non-magnetic oxides. The first layer 3A and the second layer 3B are made of the above-described non-magnetic oxides.

The first layer 3A contains, for example, an oxide of an alloy represented by $A_xB_{1-x}$. The first layer 3A is, for example, an oxide of an alloy represented by $A_xB_{1-x}$. A is the above-described element A, and B is the above-described element B. x satisfies $0 \leq x \leq 1.0$. The element A in the first layer 3A may be Mg and the element B may be Al. In this case, the first layer 3A contains, for example, an oxide of an alloy represented by $Mg_xAl_{1-x}$. The first layer 3A may be made of, for example, an oxide of an alloy represented by $Mg_xAl_{1-x}$. When the element A is Mg and the element B is Al, x satisfies, for example, $0 \leq x \leq 1.0$, preferably $0.5 \leq x \leq 1.0$.

The second layer 3B contains, for example, an oxide of an alloy represented by $A_yB_{1-y}$. The second layer 3B is, for example, an oxide of an alloy represented by $A_yB_{1-y}$. A is the above-described element A, and B is the above-described element B. y satisfies $0 \leq y \leq 0.5$. The element A in the second layer 3B may be Mg and the element B may be Al. In this case, the second layer 3B contains, for example, an oxide of an alloy represented by $Mg_yAl_{1-y}$. The second layer 3B may be made of, for example, an oxide of an alloy represented by $Mg_yAl_{1-y}$. When the element A is Mg and the element B is Al, x satisfies, for example, $0 \leq y \leq 0.5$.

For example, the first layer 3A has a higher proportion of the element A than the second layer 3B. The first layer 3A has a lower oxygen concentration than, for example, the second layer 3B. The first layer 3A is, for example, MgO, Mg—Al—O, Mg—(Al, Ga)—O. Mg—Al—O and Mg—(Al, Ga)—O are oxides of Mg and Al or Ga, and their respective ratios do not matter. The first layer 3A may contain the element B in the main MgO.

For example, the second layer 3B has a higher proportion of the element B than the first layer 3A. The second layer 3B has a higher oxygen concentration than, for example, the first layer 3A. The second layer 3B is, for example, Mg—Al—O. The second layer 3B may have an inverse spinel structure.

The composition analysis of each layer can be performed using energy dispersive X-ray analysis (EDS), secondary ion mass spectrometry (SIMS), atom probe method, and electron energy loss spectroscopy (EELS).

The crystal structure of the first layer 3A is different from that of the second layer 3B. The lattice constant of the first layer 3A is approximately half of the lattice constant of the second layer 3B. The "substantially half" includes a deviation of 4% around a value of half of the lattice constant of the second layer 3B. That is, when the lattice constant of the first layer 3A is α and the lattice constant of the second layer 3B is β, α and β satisfy the relationship of $\beta - 0.04 \times \alpha \leq 2 \times \alpha \leq \beta + 0.04 \times \alpha$.

The crystal structure of the first layer 3A is, for example, a NaCl structure or a cation disordered spinel structure. The crystal structure of the second layer 3B is, for example, an ordered spinel structure.

The crystal structure can be determined by a transmission electron microscope (TEM) image (for example, a high-angle scattering annular dark-field scanning transmission microscope image: HAADF-STEM image) or an electron diffraction image using a transmission electron beam. More specifically, it can be obtained from the spot appearing in the Fourier transform image of the HAADF-STEM image.

For example, a sliced sample of the magnetoresistive effect element 10 is irradiated with an electron beam focused to about 1 nm, and a nano electron beam diffraction (NBD) image is obtained using a transmission electron microscope (TEM). The nano electron beam diffraction image is an electron image obtained by transmitting and diffracting a sliced sample. For example, an electron beam pattern can be obtained by injecting an electron beam in the [100] direction of the sliced sample.

The electron beam pattern can be regarded as a Fourier transform of the crystal lattice, and changes in effective lattice constants and changes in crystal symmetry can be observed. The obtained electron beam pattern differs between the ordered spinel structure and the NaCl structure or the cation disordered spinel structure. In the electron beam pattern of the ordered spinel structure, ordered spots can be confirmed at the centers of the lattices in addition to the multiple diffraction spots arranged in a lattice pattern as seen in the electron beam pattern of a NaCl structure or a cation disordered spinel structure.

When the same electron beam pattern can be confirmed at ten different in-plane directions at the same height position in the stacking direction in the non-magnetic layer 3, its height position can be considered to be a layer of a particular crystal structure. The ten positions for irradiating the electron beam are set, for example, such that the non-magnetic layer 3 is divided into eleven parts at equal intervals in one direction and each of the positions between adjacent divided parts is used. For example, when it is possible to confirm the layer of confirming the electron beam pattern of the ordered spinel structure and the layer of confirming the electron beam pattern of the NaCl structure or the cation disordered spinel structure at different height positions of the non-magnetic layer 3, it can be seen that the non-magnetic layer 3 includes the first layer 3A and the second layer 3B.

Figure 2:
FIG. 2 is a schematic diagram of an ordered spinel structure.
Figure 2:
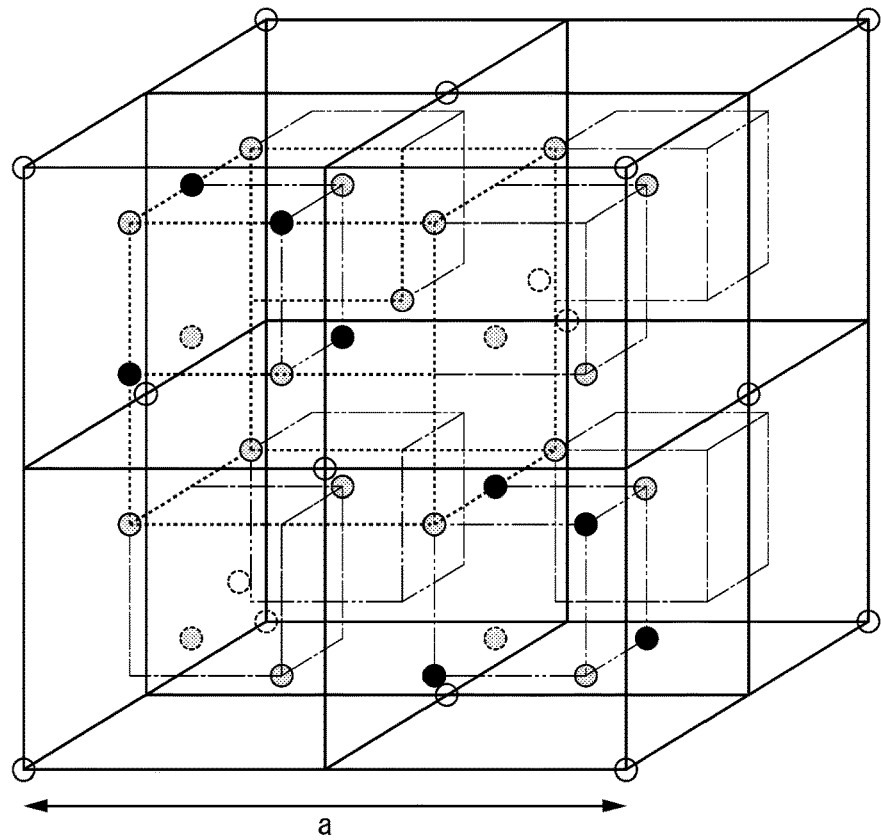

FIG. 2 is a diagram showing a crystal structure of an ordered spinel structure. In the ordered spinel structure, the site where the element A is ionized and the site where the element B is ionized are fixed and the arrangement of these elements is regular. The elements A and B are the above-described elements. Oxides of Mg and Ga (Mg—Ga—O) tend to have an ordered spinel structure.

Figure 3:
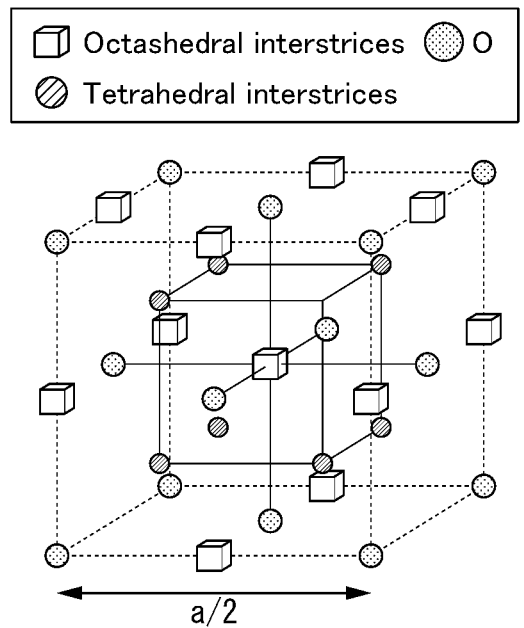
FIG. 3 is a schematic diagram of a cation disordered spinel structure (including a NaCl structure).

FIG. 3 is a diagram showing a crystal structure of the NaCl structure or the cation disordered spinel structure. In the case of the cation disordered spinel structure, the ionized element A or B can be present at both tetrahedral-coordinating and octahedral-coordinating sites with respect to oxygen. Which site the ionized element A or element B enters is random. Since the elements A and B with different atomic radii randomly enter these sites, cation sites in the crystal structure become disordered. As a special case, when all elements A and B are located in the octahedrons, this is similar to the NaCl structure. The NaCl structure can also be regarded as one type of the cation disordered spinel structure by considering the lattice defect. The cation disordered spinel structure has, for example, the symmetry of the space group of Fm-3m or the symmetry of the space group of F-43m. Oxides of Mg and Al (Mg—Al—O) tend to have a cation disordered spinel structure.

The effective lattice constants (a/2) of the NaCl structure and the cation disordered spinel structure are approximately half of the effective lattice constant (a) of the ordered spinel structure. For example, the crystal with the ordered spinel structure has a substantial lattice constant of 0.808 nm, and the crystal with the NaCl structure and the cation disordered spinel structure has a substantial lattice constant of 0.404 nm. Here, the "substantial lattice constant" is a lattice constant that is allowed when crystallized as spinel or cation disordered spinel because the lattice constant may fluctuate slightly due to oxygen deficiency or the like. Here, "substantial" means an amount of lattice deviation that does not cause loss of crystallinity, and includes a deviation of about 4% based on the value of the above lattice constant.

The difference in effective lattice constant between the ordered spinel structure and the NaCl structure or the cation disordered spinel structure can be confirmed from the difference in the electron beam pattern. The electron beam patterns of the NaCl structure and the cation disordered spinel structure observe the basic reflections from the face-centered cubic (FCC) lattice. The electron beam pattern of the ordered spinel structure observes the reflections from the {220} plane in addition to the basic reflections from the face-centered cubic (FCC) lattice. The reflections from the {220} plane correspond to the first order spots.

The film thickness of the first layer 3A and the second layer 3B is not particularly limited. As the film thickness of the non-magnetic layer increases, the area resistance RA of the magnetoresistive effect element 10 increases.

For example, the non-magnetic layer 3 is (001) oriented in the stacking direction. The non-magnetic layer 3 may be a (001) oriented single crystal or a (001) oriented crystal mainly containing a polycrystal. When the non-magnetic layer 3 is (001) oriented, the lattice matching with the first ferromagnetic layer 1 and the second ferromagnetic layer 2 is improved, and the coherent tunneling effect can be easily obtained. In particular, when the first ferromagnetic layer 1 or the second ferromagnetic layer 2 contains an Fe element, such as Fe, Co—Fe, and Co-based Heusler alloys, the lattice matching is improved.

The magnetoresistive effect element 10 is, for example, columnar. The magnetoresistive effect element 10 is, for example, circular, elliptical, quadrangular, triangular, or polygonal in a plan view from the stacking direction. From the viewpoint of symmetry, the shape of the magnetoresistive effect element 10 in a plan view from the stacking direction is preferably circular or elliptical.

The length of the long side of the magnetoresistive effect element 10 in a plan view from the stacking direction is preferably 80 nm or less, more preferably 60 nm or less, and further preferably 30 nm or less. When the length of the long side is 80 nm or less, it becomes difficult to form domain structures in the ferromagnetic layer, and it is not necessary to consider a component different from spin polarization in the ferromagnetic metal layer. Further, when the length of the long side is 30 nm or less, a single domain structure is formed in the ferromagnetic layer, and the magnetization reversal speed and probability are improved. Further, the miniaturized magnetoresistive effect element is particularly strongly required to have a low resistance.

Next, a method of manufacturing the magnetoresistive effect element 10 according to this embodiment will be described. The magnetoresistive effect element 10 can be obtained by sequentially stacking the first ferromagnetic layer 1, the non-magnetic layer 3, and the second ferromagnetic layer 2. The film forming method for each layer is, for example, a sputtering method, a thin film deposition method, a laser ablation method, or a molecular beam epitaxy (MBE) method.

The non-magnetic layer 3 is prepared by the following procedure. First, a layer to be the first layer 3A is formed. This film forming condition is a first condition. The layer to be the first layer 3A is, for example, an alloy of the element A and the element B or an oxide of this alloy.

The first condition is a condition in which the alloy to be formed is less likely to be oxidized than a second condition described later. For example, the flow rate of oxygen introduced into the oxidation treatment chamber may be smaller than the second condition described later, the oxidation time may be shorter than the second condition described later, or the amount of oxygen with respect to the composition of the target alloy may be reduced. Further, as an example, it is not necessary to oxidize the layer to be the first layer 3A under the first condition. That is, it is not necessary to supply oxygen when forming the first layer 3A. For example, in the first condition, the pressure in the oxidation treatment chamber is 0.1 Pa.

Next, a layer to be the second layer 3B is formed. This formation condition is the second condition. The layer to be the second layer 3B is, for example, an alloy of the element A and the element B, or an oxide of this alloy.

In the second condition, sufficient oxygen is supplied to the layer to be the second layer 3B to form an ordered spinel structure. For example, oxygen is supplied while stacking alloys, and the alloys are sufficiently oxidized. The oxidation method may be to oxidize while forming an alloy, may be to repeat an oxidation process by introducing oxygen into the chamber after forming the alloy, or may be to oxidize the alloy by oxygen plasma.

Then, the first layer 3A and the second layer 3B are subjected to heat treatment. The layer to be the second layer 3B combines with oxygen to become the second layer 3B. The layer to be the first layer 3A crystallizes with a small amount of oxygen discharged from the layer to be the second layer 3B. The second layer 3B crystallizes as an ordered spinel structure and the first layer 3A crystallizes as a cation disordered spinel structure.

The reason why the first layer 3A crystallizes as a cation disordered spinel is as follows. Oxygen is one of the elements responsible for the crystal lattice, and the crystal structure is disturbed when oxygen is deficient. When the crystal structure is disturbed, the energy states at the tetrahedral-coordinated sites and the octahedral-coordinated sites with respect to oxygen are also disturbed. When the energy states are disturbed, the ionized element A, which should be stabilized at the tetrahedral-coordinated sites with respect to oxygen, is stabilized at the octahedral-coordinated sites with respect to oxygen, and vice versa. Therefore, which site the element A and the element B enter becomes a random one as a whole. As a result, it becomes easier to stabilize with a disordered spinel structure.

When the first layer 3A crystallizes, the first layer 3A is (001) oriented. When the substrate 90 is (001) oriented, the first layer 3A is more likely to be (001) oriented. Then, when the first layer 3A is (001) oriented, the second layer 3B is (001) oriented.

Here, the metal elements contained in the layer to be the first layer 3A and the layer to be the second layer 3B may be mutually diffused with each other during the heat treatment. Thus, the composition of the first layer 3A and the second layer 3B at the time of film formation may be different from the composition of the first layer 3A and the second layer 3B after the heat treatment.

The MR ratio of the magnetoresistive effect element 10 according to this embodiment is high. It is considered that this is because the non-magnetic layer 3 includes the first layer 3A and the second layer 3B having different crystal structures.

When all the non-magnetic layers 3 have an ordered spinel structure structure, a band folding effect occurs due to the difference in the periodic unit of the unit cell between the first ferromagnetic layer 1 and the second ferromagnetic layer 2. When the band folding effect occurs, the MR ratio of the magnetoresistive effect element 10 decreases.

On the other hand, when all the non-magnetic layers 3 have a cation disordered spinel structure (for example, Mg—Al—O), the spins of the coherent tunneling conduction in the non-magnetic layer 3 are greatly attenuated, and a sufficient MR ratio may not be obtained.

When the non-magnetic layer 3 includes the first layer 3A and the second layer 3B, the first layer 3A suppresses the band folding effect, and the second layer 3B suppresses spin attenuation. As a result, the magnetoresistive effect element 10 exhibits a large MR ratio.

Further, the first layer 3A is excellent in lattice matching with the first ferromagnetic layer 1 and the second ferromagnetic layer 2. When the first layer 3A is on the side of the substrate 90, lattice mismatch is less likely to occur and the crystal is less likely to be disturbed when forming the first layer 3A on the first ferromagnetic layer 1. Thus, when the first layer 3A is closer to the substrate 90 than the second layer 3B, the magnetoresistive effect element 10 exhibits a higher MR ratio.

Although the embodiments of the present invention have been described in detail with reference to the drawings, each configuration in each embodiment and a combination thereof are examples, and the configuration can be added, omitted, replaced, and modified into other forms without departing from the spirit of the present invention.

First Modified Example

Figure 4:
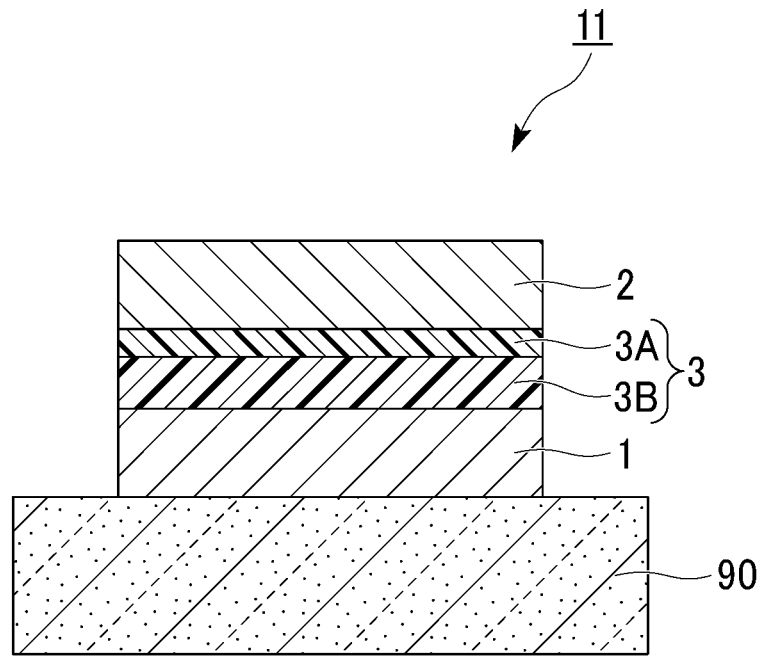
FIG. 4 is a cross-sectional view of a magnetoresistive effect element according to a first modified example.

FIG. 4 is a cross-sectional view of a magnetoresistive effect element 11 according to a first modified example. The magnetoresistive effect element 11 is different from the magnetoresistive effect element 10 in that the positional relationship of the first layer 3A and the second layer 3B is reversed. The same reference numerals are given to the same configurations as those of the magnetoresistive effect element 10, and a description thereof will be omitted.

The first layer 3A is located on the second layer 3B. The second layer 3B is closer to the substrate 90 than the first layer 3A.

The magnetoresistive effect element 11 according to the first modified example exhibits a large MR ratio since the non-magnetic layer 3 includes the first layer 3A and the second layer 3B.

The above-described magnetoresistive effect elements 10 and 11 can be used for various purposes. The magnetoresistive effect elements 10 and 11 can be applied to, for example, a magnetic head, a magnetic sensor, a magnetic memory, a high-frequency filter, and the like.

Next, application examples of the magnetoresistive effect element according to this embodiment will be described. Additionally, in the following application examples, the magnetoresistive effect element 10 is used as the magnetoresistive effect element, but the magnetoresistive effect element is not limited thereto.

Figure 5:
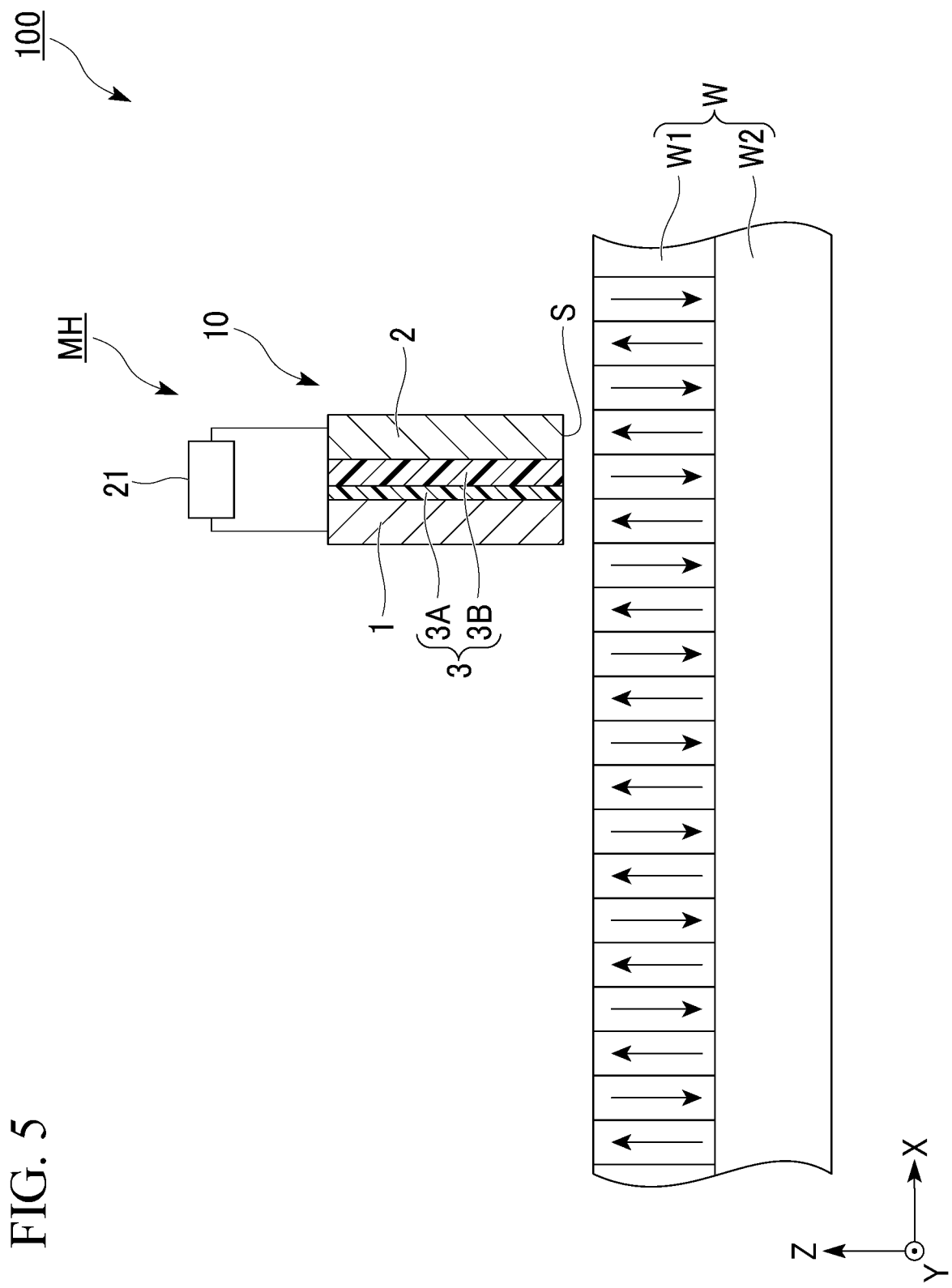
FIG. 5 is a cross-sectional view of a magnetic recording element according to Application Example 1.

FIG. 5 is a cross-sectional view of a magnetic recording element 100 according to Application Example 1. FIG. 5 is a cross-sectional view in which the magnetoresistive effect element 10 is cut along the stacking direction.

As shown in FIG. 5, the magnetic recording element 100 includes a magnetic head MH and a magnetic recording medium W. In FIG. 5, one direction in which the magnetic recording medium W extends is the X direction and a direction perpendicular to the X direction is the Y direction. The XY plane is parallel to the main surface of the magnetic recording medium W. The direction connecting the magnetic recording medium W and the magnetic head MH and perpendicular to the XY plane is the Z direction.

In the magnetic head MH, an air bearing surface (medium facing surface) S faces the surface of the magnetic recording medium W. The magnetic head MH moves in the directions of arrow +X and arrow −X along the surface of the magnetic recording medium W at a position separated from the magnetic recording medium W by a certain distance. The magnetic head MH includes the magnetoresistive effect element 10 functioning as a magnetic sensor and a magnetic recording unit (not shown). A resistance measuring instrument 21 measures the resistance value of the magnetoresistive effect element 10 in the stacking direction.

The magnetic recording unit determines the magnetization direction of a recording layer W1 by applying a magnetic field to the recording layer W1 of the magnetic recording medium W. That is, the magnetic recording unit performs magnetic recording of the magnetic recording medium W. The magnetoresistive effect element 10 reads the information on the magnetization of the recording layer W1 written by the magnetic recording unit.

The magnetic recording medium W includes the recording layer W1 and a backing layer W2. The recording layer W1 is a portion for performing magnetic recording, and the backing layer W2 is a magnetic path (magnetic flux passage) for returning the magnetic flux for writing to the magnetic head MH again. The recording layer W1 records the magnetic information as the magnetization direction.

The second ferromagnetic layer 2 of the magnetoresistive effect element 10 is, for example, a magnetization free layer. Therefore, the second ferromagnetic layer 2 exposed to the air bearing surface S is influenced by the magnetization recorded in the recording layer W1 of the facing magnetic recording medium W. For example, in FIG. 5, the magnetization direction of the second ferromagnetic layer 2 faces the +Z direction due to the influence of the magnetization facing the +Z direction of the recording layer W1. In this case, the magnetization directions of the first ferromagnetic layer 1 and the second ferromagnetic layer 2 which are the magnetization fixed layers are parallel to each other.

Here, the resistance when the magnetization directions of the first ferromagnetic layer 1 and the second ferromagnetic layer 2 are parallel and the resistance when the magnetization directions of the first ferromagnetic layer 1 and the second ferromagnetic layer 2 are antiparallel are different. As the difference between the resistance value in the parallel case and the resistance value in the antiparallel case becomes larger, the MR ratio of the magnetoresistive effect element 10 becomes larger. The magnetoresistive effect element 10 according to this embodiment has a large MR ratio. Thus, it is possible to accurately read the information of magnetization of the recording layer W1 as the change in the resistance value by the resistance measuring instrument 21.

The shape of the magnetoresistive effect element 10 of the magnetic head MH is not particularly limited. For example, the first ferromagnetic layer 1 may be installed at a position separated from the magnetic recording medium W in order to avoid the influence of the leakage magnetic field of the magnetic recording medium W on the first ferromagnetic layer 1 of the magnetoresistive effect element 10.

Figure 6:
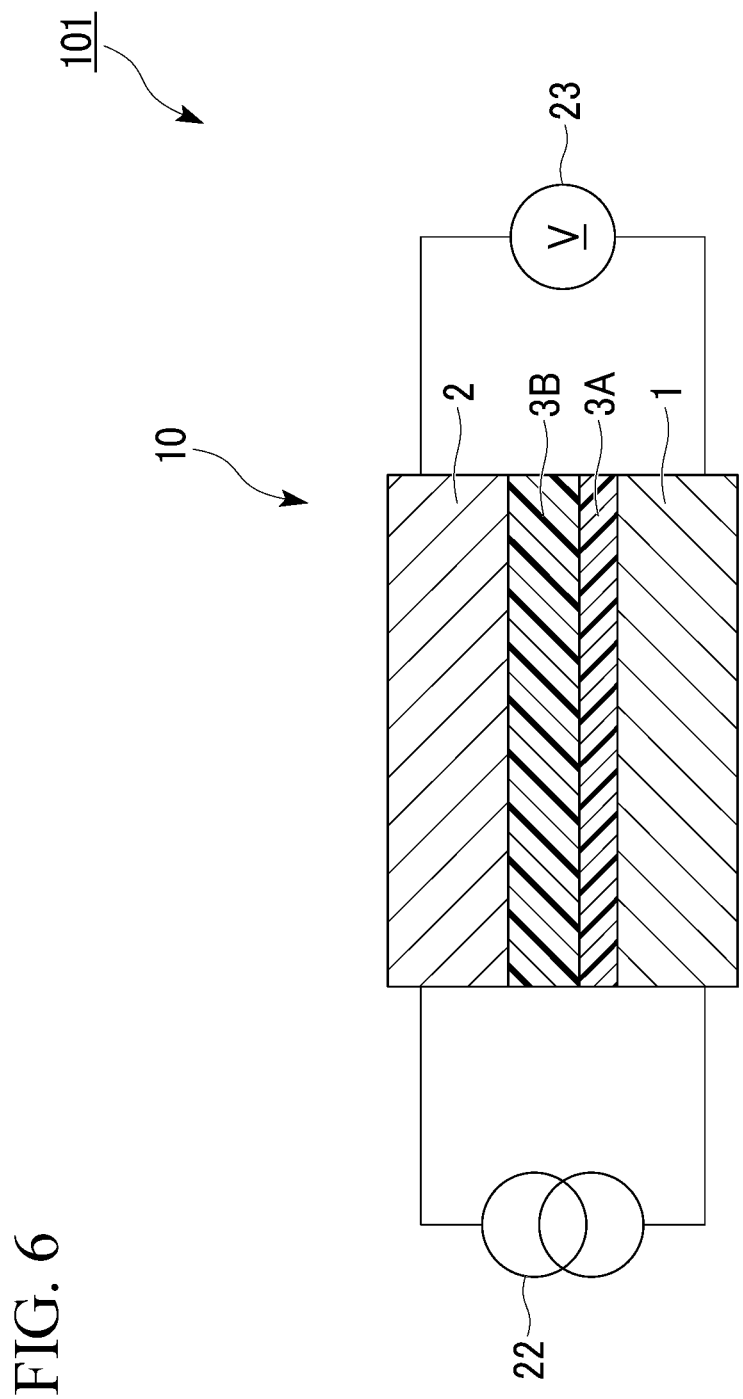
FIG. 6 is a cross-sectional view of a magnetic recording element according to Application Example 2.

FIG. 6 is a cross-sectional view of a magnetic recording element 101 according to Application Example 2. FIG. 6 is a cross-sectional view in which the magnetic recording element 101 is cut along the stacking direction.

As shown in FIG. 6, the magnetic recording element 101 includes the magnetoresistive effect element 10, a power supply 22, and a measuring unit 23. The power supply 22 gives a potential difference in the stacking direction of the magnetoresistive effect element 10. The power supply 22 is, for example, a DC power supply. The measuring unit 23 measures a resistance value of the magnetoresistive effect element 10 in the stacking direction.

When a potential difference is generated between the first ferromagnetic layer 1 and the second ferromagnetic layer 2 by the power supply 22, a current flows in the stacking direction of the magnetoresistive effect element 10. The current is spin-polarized when passing through the first ferromagnetic layer 1 and becomes a spin-polarized current. The spin-polarized current reaches the second ferromagnetic layer 2 through the non-magnetic layer 3. The magnetization of the second ferromagnetic layer 2 is reversed by receiving spin transfer torque (STT) due to spin-polarized current. As the relative angle between the magnetization direction of the first ferromagnetic layer 1 and the magnetization direction of the second ferromagnetic layer 2 changes, the resistance value of the magnetoresistive effect element 10 in the stacking direction changes. The resistance value of the magnetoresistive effect element 10 in the stacking direction is read by the measuring unit 23. That is, the magnetic recording element 101 shown in FIG. 6 is a spin transfer torque (STT) type magnetic recording element.

Since the magnetic recording element 101 shown in FIG. 6 has a large MR ratio of the magnetoresistive effect element 10, data stability is excellent.

Figure 7:
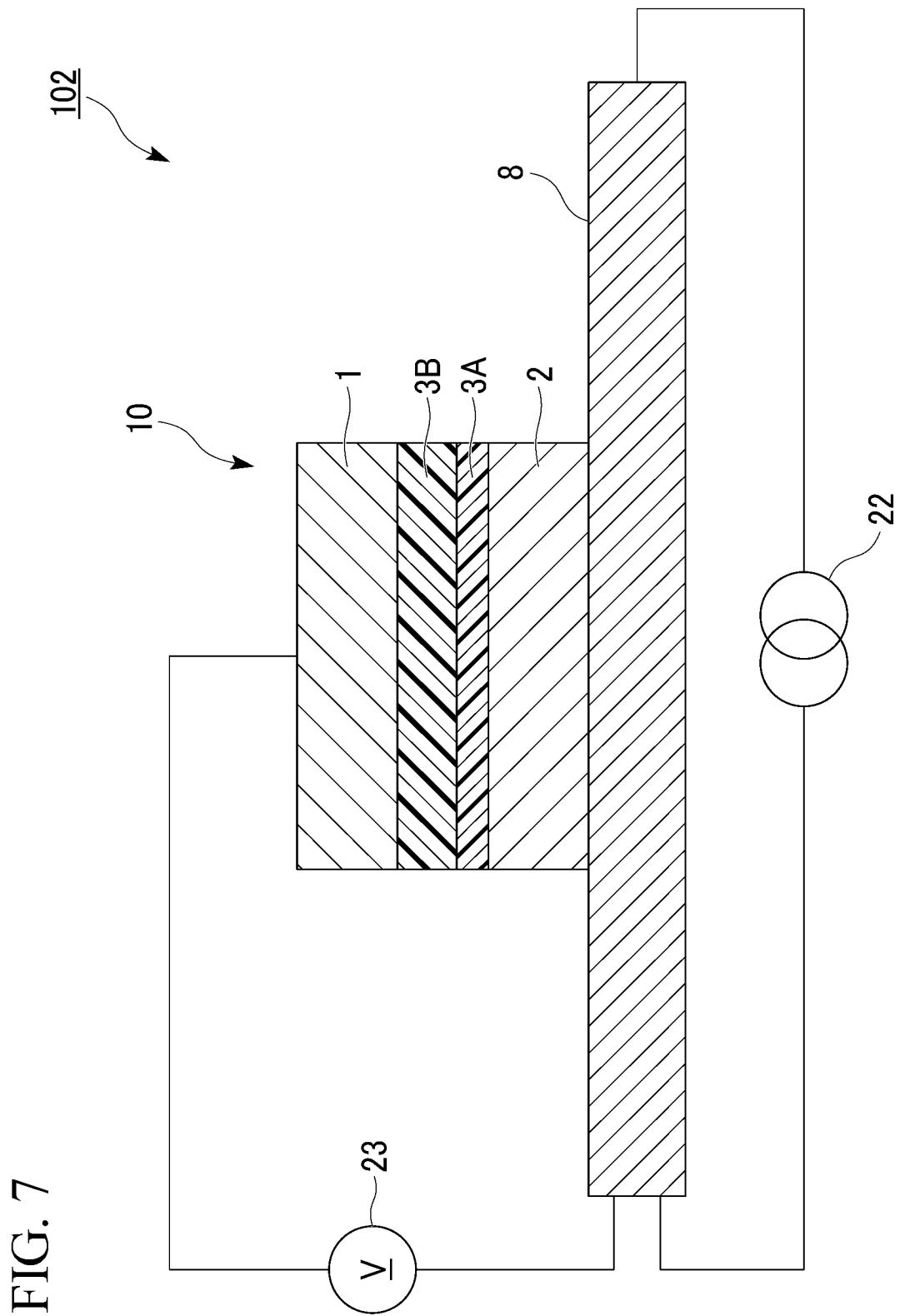
FIG. 7 is a cross-sectional view of a magnetic recording element according to Application Example 3.

FIG. 7 is a cross-sectional view of a magnetic recording element 102 according to Application Example 3. FIG. 7 is a cross-sectional view in which the magnetic recording element 102 is cut along the stacking direction.

As shown in FIG. 7, the magnetic recording element 102 includes the magnetoresistive effect element 10, a spin-orbit torque wiring 8, the power supply 22, and the measuring unit 23. The spin-orbit torque wiring 8 is in contact with, for example, the second ferromagnetic layer 2. The spin-orbit torque wiring 8 extends in one direction of the in-plane direction. The power supply 22 is connected to a first end and a second end of the spin-orbit torque wiring 8. The first end and the second end sandwich the magnetoresistive effect element 10 in a plan view. The power supply 22 allows a writing current to flow along the spin-orbit torque wiring 8. The measuring unit 23 measures the resistance value of the magnetoresistive effect element 10 in the stacking direction.

When a potential difference is generated between the first end and the second end of the spin-orbit torque wiring 8 by the power supply 22, a current flows in the in-plane direction of the spin-orbit torque wiring 8. The spin-orbit torque wiring 8 has a function of generating a spin current by the spin Hall effect when a current flows. The spin-orbit torque wiring 8 contains, for example, any of metals, alloys, intermetal compounds, metal borides, metal carbides, metal silicates, and metal phosphates that have the function of generating spin currents by the spin Hall effect when a current flows. For example, the wiring contains a non-magnetic metal having an atomic number of 39 or more having d-electrons or f-electrons in the outermost shell.

When a current flows in the in-plane direction of the spin-orbit torque wiring 8, a spin Hall effect is generated by spin-orbit interaction. The spin Hall effect is a phenomenon in which a moving spin is skewed in a direction orthogonal to the current flow direction. The spin Hall effect creates nonuniform distribution of spins in the spin-orbit torque wiring 8 and induces a spin current in the thickness direction of the spin-orbit torque wiring 8. The spin is injected into the second ferromagnetic layer 2 from the spin-orbit torque wiring 8 by the spin current.

The spin injected into the second ferromagnetic layer 2 gives spin-orbit torque (SOT) to the magnetization of the second ferromagnetic layer 2. The second ferromagnetic layer 2 receives spin-orbit torque (SOT) and inverts its magnetization. As the relative angle between the magnetization direction of the first ferromagnetic layer 1 and the magnetization direction of the second ferromagnetic layer 2 changes, the resistance value of the magnetoresistive effect element 10 in the stacking direction changes. The resistance value of the magnetoresistive effect element 10 in the stacking direction is read by the measuring unit 23. That is, the magnetic recording element 102 shown in FIG. 7 is a spin-orbit torque (SOT) type magnetic recording element.

Since the magnetic recording element 102 shown in FIG. 7 has a large MR ratio of the magnetoresistive effect element 10, data stability is excellent.

Figure 8:
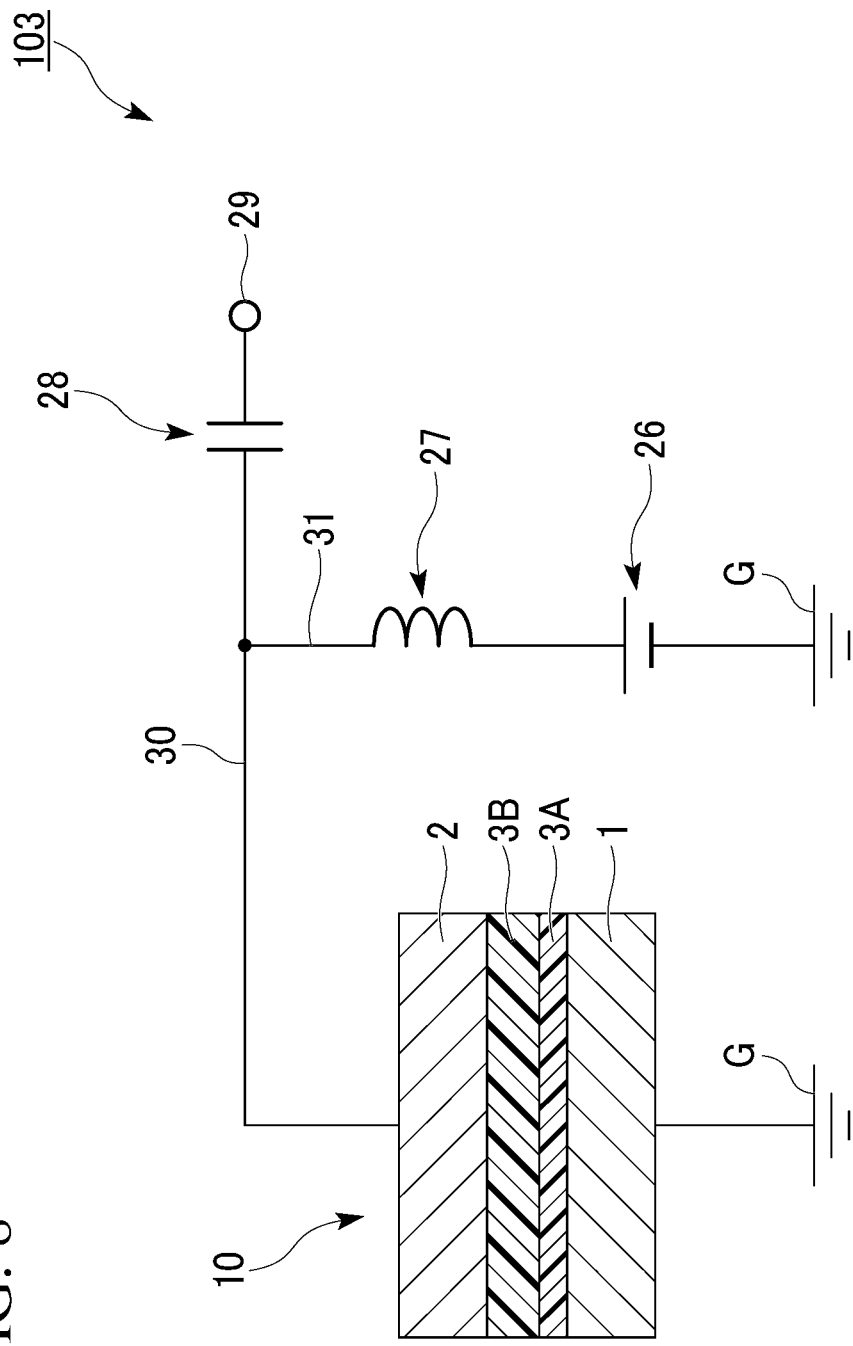
FIG. 8 is a cross-sectional view of a high-frequency device according to Application Example 4.

FIG. 8 is a schematic diagram of a high-frequency device 103 according to Application Example 4. As shown in FIG. 8, the high-frequency device 103 includes the magnetoresistive effect element 10, a DC power supply 26, an inductor 27, a capacitor 28, an output port 29, and wirings 30 and 31.

The wiring 30 connects the magnetoresistive effect element 10 to the output port 29. The wiring 31 branches from the wiring 30 and reaches a ground G via the inductor 27 and the DC power supply 26. Known DC power supplies 26, inductors 27, and capacitors 28 can be used. The inductor 27 cuts the high-frequency component of the current and passes the invariant component of the current. The capacitor 28 passes the high-frequency component of the current and cuts the invariant component of the current. The inductor 27 is disposed in a portion where the flow of high-frequency current is desired to be suppressed and the capacitor 28 is disposed in a portion where the flow of the direct current is desired to be suppressed.

When an alternating current or an alternating magnetic field is applied to the ferromagnetic layer included in the magnetoresistive effect element 10, the magnetization of the second ferromagnetic layer 2 undergoes a precession motion. The magnetization of the second ferromagnetic layer 2 oscillates strongly when the frequency of the high-frequency current or high-frequency magnetic field applied to the second ferromagnetic layer 2 is close to the ferromagnetic resonance frequency of the second ferromagnetic layer 2 and does not oscillate much at frequencies away from the ferromagnetic resonance frequency of the second ferromagnetic layer 2. This phenomenon is called a ferromagnetic resonance phenomenon.

The resistance value of the magnetoresistive effect element 10 changes due to the oscillation of the magnetization of the second ferromagnetic layer 2. The DC power supply 26 applies a direct current to the magnetoresistive effect element 10. The direct current flows in the stacking direction of the magnetoresistive effect element 10. The direct current flows to the ground G via the wirings 30 and 31 and the magnetoresistive effect element 10. The potential of the magnetoresistive effect element 10 changes according to Ohm's law. A high-frequency signal is output from the output port 29 in response to a change in the potential (a change in the resistance value) of the magnetoresistive effect element 10.

Since the high-frequency device 103 shown in FIG. 8 has a large MR ratio of the magnetoresistive effect element, a large high-frequency signal can be transmitted.

EXAMPLES

Example 1

The magnetoresistive effect element shown in FIG. 1 was prepared. The composition of each layer was as follows.
  Substrate: MgO single crystal
  Underlayer: Cr with film thickness of 40 nm
  First ferromagnetic layer 1: Fe 50 nm
  Second ferromagnetic layer 2: Fe 6 nm
  First layer 3A: Mg—Al—O (cation disordered spinel)
  Second layer 3B: Mg—Al—O (ordered spinel)

Each layer on the substrate was prepared by a sputtering method. Oxygen was not introduced when forming the metal to be the first layer 3A. A film was formed while introducing oxygen into the chamber when forming the element to be the second layer 3B. Further, a plurality of samples were prepared such that the thickness at the time of forming the metal to be the first layer 3A was fixed and the thickness of the metal to be the second layer 3B was changed. After the formation of this magnetoresistive effect element, heat treatment was performed under a magnetic field. The heat treatment temperature in this heat treatment under a magnetic field was set to 400° C. and the strength of the applied magnetic field was set to 5 kOe.

The prepared sample was sliced and a nano electron beam diffraction (NBD) image was obtained using a transmission electron microscope (TEM). As a result, a layer having a cation disordered spinel structure (corresponding to the first layer 3A) and a layer having an ordered spinel structure (corresponding to the second layer 3B) were confirmed. The layer of the cation disordered spinel structure was closer to the substrate than the layer of the ordered spinel structure. The positions of the layers having the cation disordered spinel structure and the positions of the layers having the ordered spinel structure were substantially the same as the film thicknesses of the first layer 3A and the second layer 3B at the time of film formation.

In addition, energy dispersive X-ray analysis (EDS) with a transmission electron microscope (TEM) was also performed using the sample. As a result, the first layer 3A was richer in an Mg element than the second layer 3B. On the contrary, the second layer 3B was richer in an Al element than the first layer 3A.

The MR ratio (magnetic resistance change rate) of the magnetoresistive effect element of Example 1 was measured with a plurality of samples having different film thicknesses of the non-magnetic layer. The average MR ratio of each sample was 210%.

The evaluation of the MR ratio was performed according to the following procedure. First, a shape suitable for measurement was formed using microfabrication techniques such as EB lithography and ion milling. The change in the resistance value of the magnetoresistive effect element 10 was measured by monitoring the voltage applied to the magnetoresistive effect element 10 with a voltmeter while sweeping the magnetic field from the outside to the magnetoresistive effect element 10 with a constant current flowing in the stacking direction of the magnetoresistive effect element 10. The resistance value when the magnetization directions of the first ferromagnetic layer 1 and the second ferromagnetic layer 2 were parallel and the resistance value when the magnetization directions of the first ferromagnetic layer 1 and the second ferromagnetic layer 2 were antiparallel were measured and the MR ratio was calculated from the following formula based on the obtained resistance values. The MR ratio was measured at 300 K (room temperature).

MR ratio $(\%) = (R_{AP} - R_P)/R_P \times 100$ $R_P$ is the resistance value when the magnetization directions of the first ferromagnetic layer 1 and the second ferromagnetic layer 2 are parallel and $R_{AP}$ is the resistance value when the magnetization directions of the first ferromagnetic layer 1 and the second ferromagnetic layer 2 are antiparallel.

Comparative Example 1

Comparative Example 1 is different from Example 1 in that the non-magnetic layer is only the first layer 3A. In Comparative Example 1, a plurality of samples with different thicknesses of the non-magnetic layer were prepared.

The crystal structure and composition of the prepared sample were measured in the same manner as in Example 1. The crystal structures of the samples of Comparative Example 1 were all cation disordered spinel structures. Further, Comparative Example 1 contained an Mg element and an Al element.

The MR ratio (magnetic resistance change rate) of the magnetoresistive effect element of Comparative Example 1 was measured with a plurality of samples having different film thicknesses of the non-magnetic layer. The average MR ratio of each sample was 160%.

Figure 9:
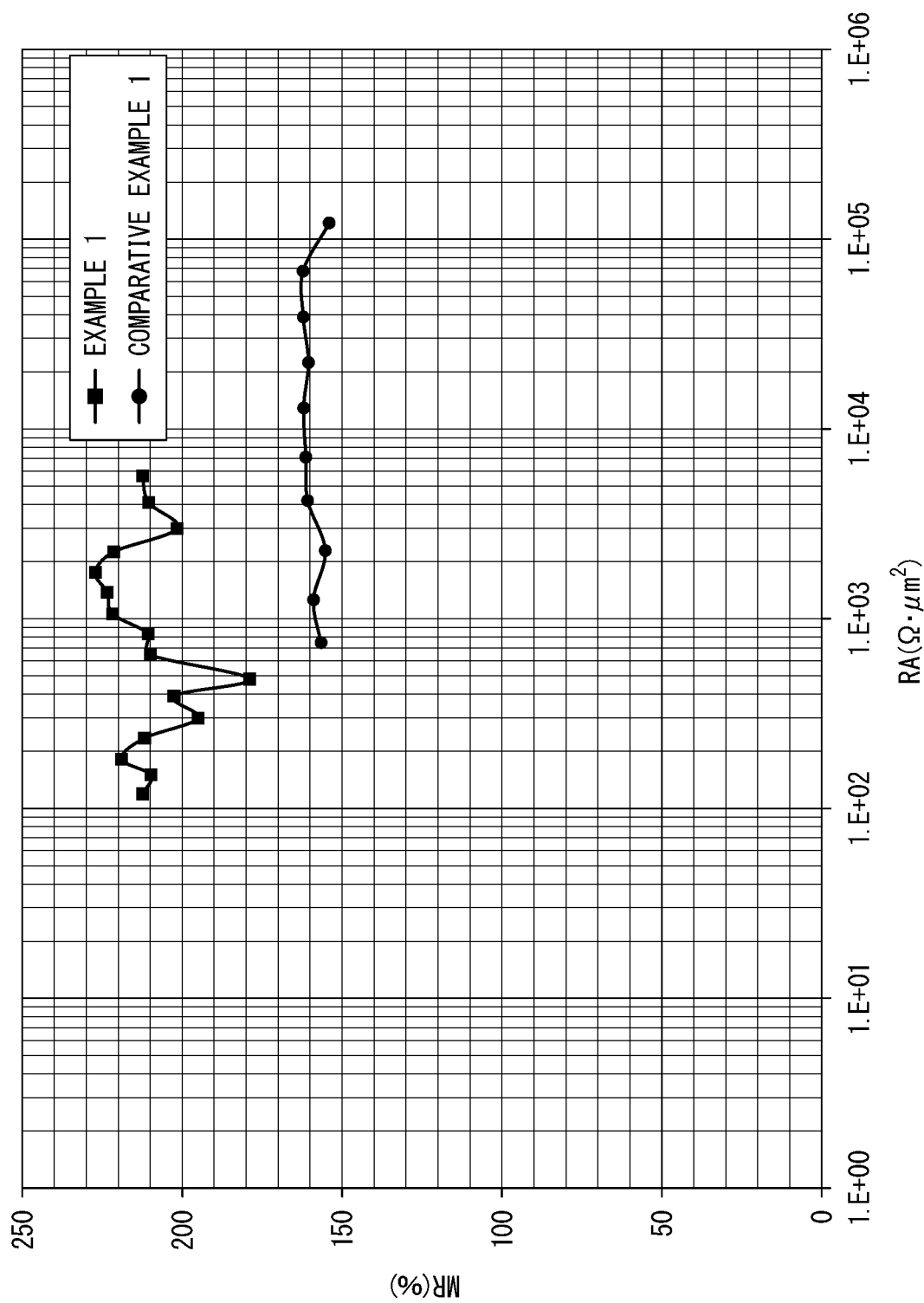
FIG. 9 is a diagram summarizing the measurement results of Example 1 and Comparative Example 1.

FIG. 9 is a diagram summarizing the measurement results of Example 1 and Comparative Example 1. The difference in RA is due to the difference in the film thickness of the non-magnetic layer.

EXPLANATION OF REFERENCES

1 First ferromagnetic layer
2 Second ferromagnetic layer
3 Non-magnetic layer
3A First layer
3B Second layer
8 Spin-orbit torque wiring
10, 11 Magnetoresistive effect element
21 Resistance measuring instrument
22 Power supply
23 Measuring unit
26 DC power supply
27 Inductor
28 Capacitor
29 Output port
30, 31 Wiring 100, 101, 102 Magnetic recording element
103 High-frequency device

What is claimed is:

1. A magnetoresistive effect element comprising:
a first ferromagnetic layer;
a second ferromagnetic layer; and
a non-magnetic layer provided between the first ferromagnetic layer and the second ferromagnetic layer,
wherein the non-magnetic layer includes a first layer and a second layer, and
wherein a lattice constant α of the first layer and a lattice constant β of the second layer satisfy a relationship of β−0.04×α≤2×α≤β+0.04×α,
wherein the first layer and the second layer are each oxides, the first layer containing at least one of elements A and optionally at least one of elements B or no element B, and the second layer containing at least one of elements B and optionally at least one of elements A or no element A,
wherein the element A is Mg or Zn,
wherein the element B is one or more selected from the group consisting of Al, Ga, Ti, and In,
wherein the first layer has a higher proportion of the element A than the second layer and the second layer has a higher proportion of the element B than the first layer.

2. The magnetoresistive effect element according to claim 1,
wherein the first layer is an oxide of an alloy of the elements A and B represented by $A_xB_{1-x}$,
wherein the second layer is an oxide of an alloy of the elements A and B represented by $A_yB_{1-y}$, and
wherein x satisfies 0≤x≤1.0 and y satisfies 0≤y≤0.5.

3. The magnetoresistive effect element according to claim 1,
wherein the first layer is an oxide of an alloy represented by $Mg_xAl_{1-x}$,
wherein the second layer is an oxide of an alloy represented by $Mg_yAl_{1-y}$, and
wherein x satisfies 0.5≤x≤1.0 and y satisfies 0≤y≤0.5.

4. The magnetoresistive effect element according to claim 1, further comprising:
a substrate on which the first ferromagnetic layer, the non-magnetic layer, and the second ferromagnetic layer are stacked,
wherein the first layer is closer to the substrate than the second layer.

5. The magnetoresistive effect element according to claim 1,
wherein the first layer has a lower oxygen concentration than the second layer.

6. The magnetoresistive effect element according to claim 1,
wherein the first layer and the second layer are mainly (001) oriented in a stacking direction.

7. A magnetoresistive effect element comprising:
a first ferromagnetic layer;
a second ferromagnetic layer; and
a non-magnetic layer provided between the first ferromagnetic layer and the second ferromagnetic layer,
wherein the non-magnetic layer includes a first layer and a second layer,
wherein a crystal structure of the first layer is a NaCl structure or a cation disordered spinel structure, and
wherein a crystal structure of the second layer is an ordered spinel structure,
wherein the first layer and the second layer are each oxides, the first layer containing at least one of elements A and optionally at least one of elements B or no element B, and the second layer containing at least one of elements B and optionally at least one of elements A or no element A,
wherein the element A is Mg or Zn,
wherein the element B is one or more selected from the group consisting of Al, Ga, Ti, and In, and
wherein the first layer has a higher proportion of the element A than the second layer and the second layer has a higher proportion of the element B than the first layer.

8. The magnetoresistive effect element according to claim 7,
wherein the first layer is an oxide of an alloy of the elements A and B represented by $A_xB_{1-x}$,
wherein the second layer is an oxide of an alloy of the elements A and B represented by $A_yB_{1-y}$, and
wherein x satisfies 0≤x≤1.0 and y satisfies 0≤y≤0.5.

9. The magnetoresistive effect element according to claim 7,
wherein the first layer is an oxide of an alloy represented by $Mg_xAl_{1-x}$,
wherein the second layer is an oxide of an alloy represented by $Mg_yAl_{1-y}$, and
wherein x satisfies 0.5≤x≤1.0 and y satisfies 0≤y≤0.5.

10. The magnetoresistive effect element according to claim 7, further comprising:
a substrate on which the first ferromagnetic layer, the non-magnetic layer, and the second ferromagnetic layer are stacked,
wherein the first layer is closer to the substrate than the second layer.

11. The magnetoresistive effect element according to claim 7,
wherein the first layer has a lower oxygen concentration than the second layer.

12. The magnetoresistive effect element according to claim 7,
wherein the first layer and the second layer are mainly (001) oriented in a stacking direction.

* * * * *